(12) United States Patent
Horiuchi et al.

(10) Patent No.: US 9,899,974 B2
(45) Date of Patent: Feb. 20, 2018

(54) CHOPPER STABILIZED AMPLIFIER

(71) Applicant: ROHM CO., LTD., Ukyo-Ku, Kyoto (JP)

(72) Inventors: Sachito Horiuchi, Kyoto (JP); Naohiro Nomura, Kyoto (JP)

(73) Assignee: ROHM CO., LTD., Ukyo-ku, Kyoto (JP)

( * ) Notice: Subject to any disclaimer, the term of this patent is extended or adjusted under 35 U.S.C. 154(b) by 0 days.

(21) Appl. No.: 15/293,675

(22) Filed: Oct. 14, 2016

(65) Prior Publication Data

US 2017/0111018 A1 Apr. 20, 2017

(30) Foreign Application Priority Data

Oct. 16, 2015 (JP) .................................. 2015-204982

(51) Int. Cl.
*H03F 1/02* (2006.01)
*H03F 3/45* (2006.01)
(Continued)

(52) U.S. Cl.
CPC ......... *H03F 3/45636* (2013.01); *H03F 3/393* (2013.01); *H03F 3/45183* (2013.01);
(Continued)

(58) Field of Classification Search
CPC . H03F 1/02; H03F 1/303; H03F 3/005; H03F 3/2178; H03F 1/34; H03F 3/45;
(Continued)

(56) References Cited

U.S. PATENT DOCUMENTS 7,535,295 B1 * 5/2009 Huijsing ................... H03F 1/26
                                                          327/124
7,696,817 B1 * 4/2010 Boucher ............. H03F 3/45475
                                                          330/51
(Continued)

OTHER PUBLICATIONS

Reza Moghimi, "To Chop or Auto-Zero: That is the Question" Analog Devices, Inc., Technical Article MS-2062, Jun. 2011, pp. 1-6; <URL: http://www.analog.com/media/en/technical-documentation/technical-articles/MS-2062.pdf >.

*Primary Examiner* — Khanh V Nguyen
(74) *Attorney, Agent, or Firm* — Cantor Colburn LLP

(57) ABSTRACT

A main amplifier generates an output signal $S_{OUT}$ according to a difference between first and second voltages VP and VN. A first gm amplifier is arranged as a differential input stage. A second, fully differential, gm amplifier amplifies a voltage difference between its non-inverting and inverting input terminals, and outputs a differential current signal $I_{3N}/I_{3P}$ via its inverting and non-inverting output terminals. An integrator integrates a differential input current $I_{4P}/I_{4N}$ input via its non-inverting and inverting input terminals, and samples and holds the signal every predetermined period, to generate a differential voltage signal. A first selector is arranged as an upstream stage of the second gm amplifier, and outputs the differential input signal without change or otherwise after swapping. A second selector is arranged as a downstream stage of the second gm amplifier, and outputs the signal $I_{3N}/I_{3P}$ output from the second gm amplifier without change or otherwise after swapping.

18 Claims, 8 Drawing Sheets

(51) Int. Cl.
  *H03F 3/393*    (2006.01)
  *H03F 3/00*    (2006.01)
  *H03F 1/30*    (2006.01)
  *H03F 1/34*    (2006.01)

(52) U.S. Cl.
  CPC ..... *H03F 3/45475* (2013.01); *H03F 3/45744* (2013.01); *H03F 1/02* (2013.01); *H03F 1/303* (2013.01); *H03F 1/34* (2013.01); *H03F 3/005* (2013.01); *H03F 3/45* (2013.01); *H03F 2203/45014* (2013.01); *H03F 2203/45026* (2013.01); *H03F 2203/45116* (2013.01); *H03F 2203/45174* (2013.01); *H03F 2203/45444* (2013.01)

(58) Field of Classification Search
  CPC ............. H03F 3/45183; H03F 3/45479; H03F 3/45636; H03F 3/393; H03F 3/45475; H03F 3/45744
  USPC ...................................... 330/9, 258
  See application file for complete search history.

(56) References Cited

U.S. PATENT DOCUMENTS

| | | | |
|---|---|---|---|
| 8,120,422 B1 * | 2/2012 | Huijsing | H03F 1/083 327/124 |
| 9,294,049 B2 * | 3/2016 | Huijsing | H03F 1/56 |
| 9,634,617 B2 * | 4/2017 | Ivanov | H03F 1/3223 |

* cited by examiner

CHOPPER STABILIZED AMPLIFIER

CROSS-REFERENCE TO RELATED APPLICATIONS

This application is based upon and claims the benefit of priority from the prior Japanese Patent Application No. 2015-204982, filed Oct. 16, 2015, the entire contents of which are incorporated herein by reference.

BACKGROUND OF THE INVENTION

1. Field of the Invention

The present invention relates to a chopper stabilized amplifier.

2. Description of the Related Art

The input offset voltage is one of the characteristics of an operational amplifier. An ideal operational amplifier has an input offset voltage (which is also referred to simply as an "offset voltage") of zero. However, in actuality, an operational amplifier has a non-zero offset voltage. As a method for adjusting the offset voltage such that it becomes zero, a trimming method is known in which trimming is performed for every semiconductor chip in the manufacturing process such that its offset voltage becomes zero. However, such a trimming method has a problem of increased costs.

To cancel the offset voltage without the need for the trimming method, an operational amplifier that is referred to as a "chopper stabilized amplifier" or "auto-zero amplifier" has been proposed. FIG. 1 is a circuit diagram showing a chopper stabilized amplifier 200 investigated by the present inventors.

The chopper stabilized amplifier 200 amplifies the voltage difference between VP at a non-inverting input terminal (+) and VN at an inverting input terminal (−), and outputs an output signal $S_{OUT}$ via an output terminal OUT according to the voltage difference.

The chopper stabilized amplifier 200 includes a main amplifier 210 and a pair of correction amplifiers 220 and 230. The main amplifier 210 includes a differential input stage 212 and an output stage 214. The differential input stage 212 is configured as a gm amplifier (transconductance amplifier) having a non-zero offset voltage $V_{OS1}$, for example. The output stage 214 converts a differential output of the differential input stage 212 into a single-ended signal.

The correction amplifiers 220 and 230, a current summing amplifier 240, and multiple switches SW21 and SW30 are provided in order to cancel out the offset voltage $V_{OS1}$ of the main amplifier 210.

The multiple switches SW21 through SW30 alternately switch the state between a state A as shown in the drawing and a state B, which is a complementary state of the state A, according to a clock. In the state A, the first correction amplifier 220 corrects the offset voltage $V_{OS1}$. In the state B, the second correction amplifier 230 corrects the offset voltage $V_{OS1}$.

The correction amplifier 220 (230) includes a gm amplifier 222 (232) configured as a first stage and a gm amplifier 224 (234) configured as a second stage.

In the state A, the first-stage gm amplifier 222 of the first correction amplifier 220 receives the voltage VP at the non-inverting input terminal (+) and the voltage VN at the inverting input terminal (−), and amplifies the voltage difference between them. The output current of the gm amplifier 222 is converted into a voltage signal by means of capacitors C21 and C22 connected to the output terminals. The voltage signal thus converted is input to the current summing amplifier 240 via the switches SW25 and W26. The current summing amplifier 240 amplifies the voltage across the capacitor C21 and the voltage across the capacitor C22, and superimposes the differential current configured as the output of the gm amplifier 240 on the differential current output from the differential input stage 212 of the main amplifier 210.

In the state B, the first-stage gm amplifier 232 of the second correction amplifier 230 receives the voltage VP at the non-inverting input terminal (+) and the voltage VN at the inverting input terminal (−), and amplifies the voltage difference between them. The output current of the gm amplifier 232 is converted into a voltage signal by means of capacitors C23 and C24 connected to the output terminals. The voltage signal thus converted is input to the current summing amplifier 240 via the switches SW25 and W26. The current summing amplifier 240 amplifies the voltage across the capacitor C23 and the voltage across the capacitor C24, and superimposes the differential current configured as the output of the gm amplifier 240 on the differential current output from the differential input stage 212 of the main amplifier 210.

By repeatedly switching the state between the state A and the state B, such an arrangement is capable of canceling out the offset voltage $V_{OS1}$ of the main amplifier 210.

However, the gm amplifiers 222 and 232, which are used for correction, also have non-zero offset voltages $V_{OS2}$ and $V_{OS3}$. In a case in which the offset voltages $V_{OS2}$ and $V_{OS3}$ are not negligible, such an arrangement is not capable of canceling out the offset voltage $V_{OS1}$ with high precision. In order to cancel out the offset voltage $V_{OS2}$ ($V_{OS3}$), which is the offset of the correction amplifier 220 (230) itself, the second-stage gm amplifier 224 (234) feedback controls a bias current applied to the first-stage gm amplifier 222 such that the effect of the offset voltage $V_{OS2}$ ($V_{OS3}$) becomes zero.

Specifically, in the state A, the offset voltage $V_{OS3}$ of the correction amplifier 230 is corrected. In the state B, the offset voltage $V_{OS2}$ of the correction amplifier 220 is corrected. In the state A, the voltage difference between the differential input pair of the gm amplifier 232 is set to zero. In this state, the capacitors C23 and C24 connected to the output of the gm amplifier 232 provide a voltage difference that corresponds to the offset voltage $V_{OS3}$. The second-stage gm amplifier 234 corrects the gm amplifier 232 such that the voltage difference that occurs between the capacitors C23 and C24 approaches zero.

The chopper stabilized amplifier 200 shown in FIG. 1 requires such multiple correction amplifiers 220 and 230, which is a problem. Furthermore, such an arrangement requires a complicated wiring pattern and a large circuit area, which is another problem.

SUMMARY OF THE INVENTION

The present invention has been made in view of such a situation. Accordingly, it is an exemplary purpose of an embodiment of the present invention to provide a chopper stabilized amplifier having a simple configuration.

An embodiment of the present invention relates to a chopper stabilized amplifier. The chopper stabilized amplifier comprises: a non-inverting input pin that receives a first voltage; an inverting input pin that receives a second voltage; a main amplifier that generates an output signal according to a difference between the first voltage and the second voltage; and a correction circuit. The main amplifier comprises: a differential input stage that generates a first current signal, wherein the differential input stage includes a first gm amplifier having a non-inverting input terminal connected to the non-inverting input pin and an inverting input terminal connected to the inverting input pin; and an output stage that receives the first current signal so as to generate the output signal of the main amplifier. The correction circuit comprises: a second gm amplifier configured as a fully differential amplifier that amplifies a voltage difference between its non-inverting input terminal and its inverting input terminal, so as to output a differential current signal from its inverting output terminal and its non-inverting output terminal; an integrating circuit that integrates a differential input current input to its non-inverting input terminal and its inverting input terminal, that samples and holds the current thus integrated for a predetermined period, and that generates a differential voltage signal; a first selector arranged as an upstream stage of the second gm amplifier, so as to switch a state between: (i) a first state in which the non-inverting input pin and the inverting input pin are respectively connected to the inverting input terminal and the non-inverting input terminal of the second gm amplifier; and (ii) a second state in which the non-inverting input pin and the inverting input pin are respectively connected to the non-inverting input terminal and the inverting input terminal of the second gm amplifier; a second selector arranged downstream from the second gm amplifier, so as to switch a state between: (i) a first state in which the inverting output terminal and the non-inverting output terminal of the second gm amplifier are respectively connected to the inverting input terminal and the non-inverting input terminal of the integrating circuit; and (ii) a second state in which the inverting output terminal and the non-inverting output terminal of the second gm amplifier are respectively connected to the non-inverting input terminal and the inverting input terminal of the integrating circuit; and a third gm amplifier that converts the differential voltage signal generated by the integrating circuit into a second current signal, and that superimposes the second current signal on the first current signal.

Such an embodiment provides a simple circuit configuration as compared with the chopper stabilized amplifier shown in FIG. 1.

Also, the integrating circuit may comprise: an integrator that integrates a differential input current input to the non-inverting input terminal and the inverting input terminal, so as to generate a differential voltage signal; and a sample-and-hold circuit that samples and holds the differential voltage signal generated by the integrator.

Also, each of the first gm amplifier and the third gm amplifier may be configured as a fully differential amplifier. Also, the second current signal configured as a differential signal may be superimposed on the second current signal configured as a differential signal.

Also, each of the first selector and the second selector may be controlled according to a first clock signal.

Also, the integrating circuit may be controlled such that the integrating circuit is set to a hold state at an edge timing of the first clock signal. Such an arrangement makes it possible to suppress contamination of the main amplifier with noise due to the first clock signal.

Also, the integrating circuit may be controlled such that the integrating circuit performs a sampling operation in a period in which the first clock is stable. Such an arrangement makes it possible to suppress contamination of the main amplifier with noise due to the first clock signal.

Also, the integrating circuit may be controlled according to a second clock signal. Also, edges of the first clock signal may be shifted from edges of the second clock signal.

Also, the second clock signal may have a period $T_B$ which is an integer multiple of a period of the first clock signal. In this case, such an arrangement allows the first clock signal and the second clock signal to be generated in a simple manner using a frequency divider or otherwise a frequency multiplier.

Also, the second clock signal may have a period $T_B$ that is twice the period of the first clock signal. Also, each edge of the second clock may be shifted by ⅛ of the period thereof ($T_B/8$) with respect to an edge of the first clock signal.

Also, the second gm amplifier may comprise a first transistor and a second transistor, each of which is configured as a MOSFET (Metal Oxide Semiconductor Field Effect Transistor). Also, a source of each of the first transistor and the second transistor may be connected to a common tail current source. Also, the second gm amplifier may output currents that respectively flow through the first transistor and the second transistor.

Also, the integrator may comprise: a third transistor configured as a MOSFET having a source connected to a fixed voltage line and a gate receiving one component of the differential current signal output from the second selector; a fourth transistor configured as a MOSFET having a source connected to the fixed voltage line and a gate receiving the other component of the differential current signal output from the second selector; a first capacitor arranged between the gate and a drain of the third transistor; and a second capacitor arranged between the gate and a drain of the fourth transistor.

Also, the chopper stabilized amplifier according to an embodiment may further comprise a common mode feedback circuit that adjusts a bias state of the second gm amplifier such that an intermediate voltage between two output voltages of the integrator approaches a target voltage.

Also, the chopper stabilized amplifier according to an embodiment may further comprise: a third capacitor arranged between a first output terminal of the first selector and one input terminal of the second gm amplifier; and a fourth capacitor arranged between a second output terminal of the first selector and the other input terminal of the second gm amplifier.

Also, each of the first selector and the sample-and-hold circuit may comprise multiple CMOS switches. Also, each of the multiple CMOS switches included in the first selector may be smaller than each of the multiple CMOS switches included in the sample-and-hold circuit.

By configuring the CMOS switch of the first selector to have a reduced parasitic capacitance, such an arrangement makes it possible to reduce chopper noise.

Also, each of the first selector and the second selector may comprise multiple CMOS switches. Also, each of the multiple CMOS switches included in the first selector may be smaller than each of the multiple CMOS switches included in the second selector.

Also, the first selector may comprise multiple CMOS switches. Also, each of the multiple CMOS switches may comprise a P-channel MOSFET (PMOS transistor) and an N-channel MOSFET (NMOS transistor), each of which is configured such that a product of a channel width W and a channel length L thereof is smaller than 1 $\mu m^2$.

By configuring the CMOS switch of the first selector to have a reduced parasitic capacitance, such an arrangement makes it possible to reduce chopper noise.

Also, each CMOS switch may comprise a P-channel MOSFET and an N-channel MOSFET, each of which has the same size.

With conventional techniques, such a PMOS transistor and an NMOS transistor are typically configured to have different sizes such that they provide the same current capacity. By configuring such a PMOS transistor and an NMOS transistor to have the same size, such an arrangement makes it possible to further reduce chopper noise.

Also, the chopper stabilized amplifier according to an embodiment may further comprise a frequency divider circuit that divides a frequency of the first clock signal so as to generate the second clock signal. Also, the frequency divider circuit may comprise a D flip-flop. Also the D flip-flop may comprise multiple CMOS switches. Also, among the CMOS switches, a part that is arranged between an input terminal and an output terminal of the D flip-flop may comprise an N-channel MOSFET having a channel length that is greater than a channel length of an N-channel MOSFET of the other part that is arranged in a different region of the D flip-flop.

Also, the chopper stabilized amplifier according to an embodiment may be monolithically integrated on a single semiconductor substrate.

Examples of such a "monolithically integrated" arrangement include: an arrangement in which all the circuit components are formed on a semiconductor substrate; and an arrangement in which principal circuit components are monolithically integrated. Also, a part of the circuit components such as resistors and capacitors may be arranged in the form of components external to such a semiconductor substrate in order to adjust the circuit constants.

By monolithically integrating the circuit on a single chip, such an arrangement allows the circuit area to be reduced, and allows the circuit elements to have uniform characteristics.

It is to be noted that any arbitrary combination or rearrangement of the above-described structural components and so forth is effective as and encompassed by the present embodiments. Moreover, this summary of the invention does not necessarily describe all necessary features so that the invention may also be a sub-combination of these described features.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION OF THE INVENTION

The invention will now be described based on preferred embodiments which do not intend to limit the scope of the present invention but exemplify the invention. All of the features and the combinations thereof described in the embodiment are not necessarily essential to the invention.

In the present specification, the state represented by the phrase the member A is connected to the member B" includes a state in which the member A is indirectly connected to the member B via another member that does not substantially affect the electric connection therebetween, or that does not damage the functions or effects of the connection therebetween, in addition to a state in which the member A is physically and directly connected to the member B.

Similarly, the state represented by the phrase "the member C is provided between the member A and the member B" includes a state in which the member A is indirectly connected to the member C, or the member B is indirectly connected to the member C via another member that does not substantially affect the electric connection therebetween, or that does not damage the functions or effects of the connection therebetween, in addition to a state in which the member A is directly connected to the member C, or the member B is directly connected to the member C.

Figure 2:
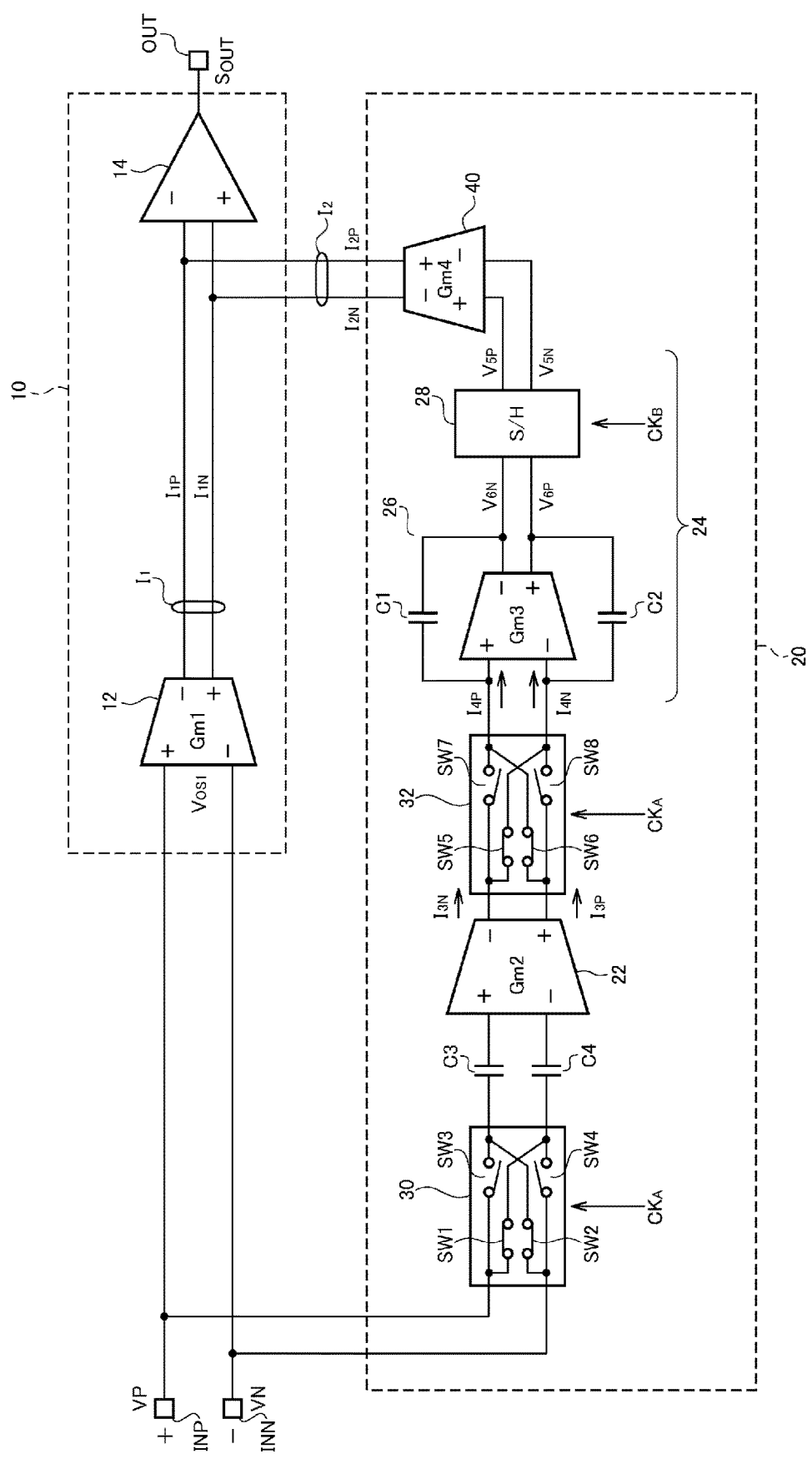
FIG. 2 is a circuit diagram showing a chopper stabilized amplifier according to an embodiment.

FIG. 2 is a circuit diagram showing a chopper stabilized amplifier 1 according to an embodiment. The chopper stabilized amplifier 1 is configured as an operational amplifier having a non-inverting input pin INP (+), an inverting input pin INN(−), and an output terminal OUT. The chopper stabilized amplifier 1 amplifies the voltage difference between the voltage (which will be referred to as the "first voltage") VP at the non-inverting input terminal and the voltage (which will be referred to as the "second voltage") VN at the inverting input terminal, and outputs an output signal $S_{OUT}$ via the output terminal OUT according to the voltage difference. The output signal $S_{OUT}$ may be configured as a voltage signal or otherwise a current signal. The chopper stabilized amplifier 1 may be monolithically integrated on a single semiconductor substrate.

A main amplifier 10 generates the output signal $S_{OUT}$ that corresponds to the difference between the first voltage VP and the second voltage VN. The main amplifier 10 includes a first gm amplifier 12 configured as a differential input stage and an output stage 14. The first gm amplifier 12 is arranged such that its non-inverting input terminal is connected to the non-inverting input pin INP(+), and such that its inverting input terminal is connected to the inverting input pin INN (−), so as to generate a first current signal $I_1$. The output stage 14 receives the first current signal $I_1$, and generates the output signal $S_{OUT}$ of the main amplifier 10. In the present embodiment, the first gm amplifier 12 is configured as a fully differential amplifier. The first current signal $I_1$ is configured as a differential signal.

The first gm amplifier 12 of the main amplifier 10 has an offset voltage $V_{OS1}$. The correction circuit 20 cancels out the effect of the offset voltage $V_{OS1}$. The correction circuit 20 will also be referred to as a "chopper stabilizer".

The correction circuit 20 includes a second gm amplifier 22, an integrating circuit 24, a first selector 30, a second selector 32, and a third gm amplifier 40. The second gm amplifier 22, configured as a fully differential amplifier, amplifies the voltage difference between its non-inverting terminal (+) and input terminal (−), and outputs differential current signals $I_{3P}$ and $I_{3N}$ via its inverting output terminal (−) and non-inverting output terminal (+).

The integrating circuit 24 has a non-inverting input terminal (+) and an inverting input terminal (−). The integrating circuit 24 integrates the differential input currents $L_{4P}$ and $L_{IN}$ respectively input to the non-inverting input terminal (+) and the inverting input terminal (−), and samples and holds the integrated signals, so as to generate differential voltage signals $V_{5P}$ and $V_{5N}$.

The integrating circuit 24 includes an integrator 26 and a sample-and-hold circuit 28.

The integrator 26 integrates the differential input currents $L_{4P}$ and $L_{IN}$ respectively input to the non-inverting input terminal and the inverting input terminal of the integrating circuit 24, so as to generate differential voltage signals $V_{6N}$ and $V_{6P}$. The sample-and-hold circuit 28 samples and holds, with a predetermined frequency, the differential voltage signals $V_{6N}$ and $V_{6P}$ generated by the integrator 26.

The first selector 30 is provided as an upstream stage of the second gm amplifier 22. The first selector 30 switches the state between: (i) a first state ϕ1 in which the non-inverting input pin INP(+) and the inverting input pin INN(−) are respectively connected to the inverting input terminal and the non-inverting input terminal of the second gm amplifier 22; and (ii) a second state ϕ2 in which the non-inverting input pin INP(+) and the inverting input pin INN(−) are respectively connected to the non-inverting input terminal and the inverting input terminal of the second gm amplifier 22. FIG. 2 shows the first state ϕ1. The first selector 30 includes multiple switches SW1 through SW4. Each switch may be configured as a CMOS switch (CMOS transfer gate). The switches SW1 and SW2 are turned on in the first state ϕ1, and turned off in the second state ϕ2. Conversely, the switches SW3 and SW4 are turned off in the first state ϕ1, and turned on in the second state ϕ2. A third capacitor C3 and a fourth capacitor C4 are arranged for DC blocking between the first selector 30 and the second gm amplifier 22.

The second selector 32 is provided as a downstream stage of the second gm amplifier 22. The second selector 32 switches the state between: (i) a first state ϕ1 in which the inverting output terminal (−) and the non-inverting output terminal (+) of the second gm amplifier are respectively connected to the inverting input terminal (−) and the non-inverting input terminal (+) of the integrating circuit 24; and (ii) a second state ϕ2 in which the inverting output terminal (−) and the non-inverting output terminal (+) of the second gm amplifier are respectively connected to the non-inverting input terminal (+) and the inverting input terminal (−) of the integrating circuit 24. The second selector 32 includes multiple switches SW5 through SW8. Each switch may be configured as a CMOS switch (CMOS transfer gate). The switches SW5 and SW6 are turned on in the first state ϕ1, and turned off in the second state ϕ2. Conversely, the switches SW7 and SW8 are turned off in the first state ϕ1, and turned on in the second state ϕ2.

The third gm amplifier 40 converts differential voltage signals $V_{5P}$ and $V_{5N}$ generated by the integrating circuit 24 into a second current signal $I_2$, and superimposes the second current signal $I_2$ thus converted on the first current signal $I_1$. In the present embodiment, the first gm amplifier 12 and the third gm amplifier 40 are each configured as a fully differential amplifier, and superimpose the differential second current signals $I_{2P}$ and $I_{2N}$ on the differential first current signals $I_{1P}$ and $I_{1N}$.

The above is the basic configuration of the chopper stabilized amplifier 1. Next, description will be made regarding the operation thereof.

The switching operations of the first selector 30 and the second selector 32 are controlled according to a common first clock signal (which will also be referred to as a "chopper clock") $CK_A$, so as to alternately switch the state between the first state ϕ1 and the second state ϕ2.

The correction circuit 20 performs a switching operation between the first state ϕ1 and the second state ϕ2. In the switching operation, the offset voltage $V_{OS1}$ of the first gm amplifier 12 is modulated, and the modulated offset voltage $V_{OS1}$ is acquired by the integrating circuit 24. In this operation, the DC component is removed by the capacitors C3 and C4. In the first state ϕ1, the first voltage VP is input to the non-inverting input terminal of the integrating circuit 24 via a path comprising the switch SW1, the capacitor C4, the second gm amplifier 22, and the switch SW6. In the second state ϕ2, the first voltage VP is input to the same input terminal of the integrating circuit 24, i.e., the non-inverting input terminal, via another path comprising the switch SW3, the capacitor C3, the second gm amplifier 22, and the switch SW7. The second voltage VN is transmitted via a path opposite to that of the first voltage VP. The second voltage VN is input to the inverting input terminal of the integrating circuit 24 regardless of whether the state is switched to the first state ϕ1 or the second state ϕ2. That is to say, by inputting the first voltage VP and the second voltage VN via the first selector 30 and the second selector 32, such an arrangement allows the integrating circuit 24 to acquire the offset voltage $V_{OS1}$ with the same polarity regardless of whether the state is switched to the first state ϕ1 or the second state ϕ2.

Furthermore, the third gm amplifier 40 superimposes the second current signal $I_2$ that corresponds to the offset voltage $V_{OS1}$ on the first current signal $I_1$, thereby canceling out the offset voltage $V_{OS1}$.

In the switching operation of the correction circuit 20 for switching the state between the first state ϕ1 and the second state ϕ2, the integrating circuit 24 also acquires the offset voltage $V_{OS2}$ of the second gm amplifier 22. Directing attention to the output current $I_{3N}$, which is one of the output currents of the second gm amplifier 22, in the first state ϕ1, the output current $I_{3N}$ is input to the inverting-input terminal of the integrating circuit 24 via the switch SW5. In the second state ϕ2, the output current $I_{3N}$ is input to the non-inverting input terminal of the integrating circuit 24 via the switch SW7. Directing attention to the output current $I_{3P}$, which is the other of the output currents of the second gm amplifier 22, in the first state ϕ1, the output current $L_p$ is input to the non-inverting input terminal of the integrating circuit 24 via the switch SW6. In the second state ϕ2, the output current $I_{3P}$ is input to the inverting input terminal of the integrating circuit 24 via the switch SW8. That is to say, the offset voltage $V_{OS2}$ of the second gm amplifier 22 is transmitted via the second selector 32 alone. With such an arrangement, in the first state ϕ1, the integrating circuit 24 acquires the offset voltage $V_{OS2}$ of the second gm amplifier 22 with a given polarity. In the second state ϕ2, the integrating circuit 24 acquires the offset voltage $V_{OS2}$ with an opposite polarity.

Figure 1:
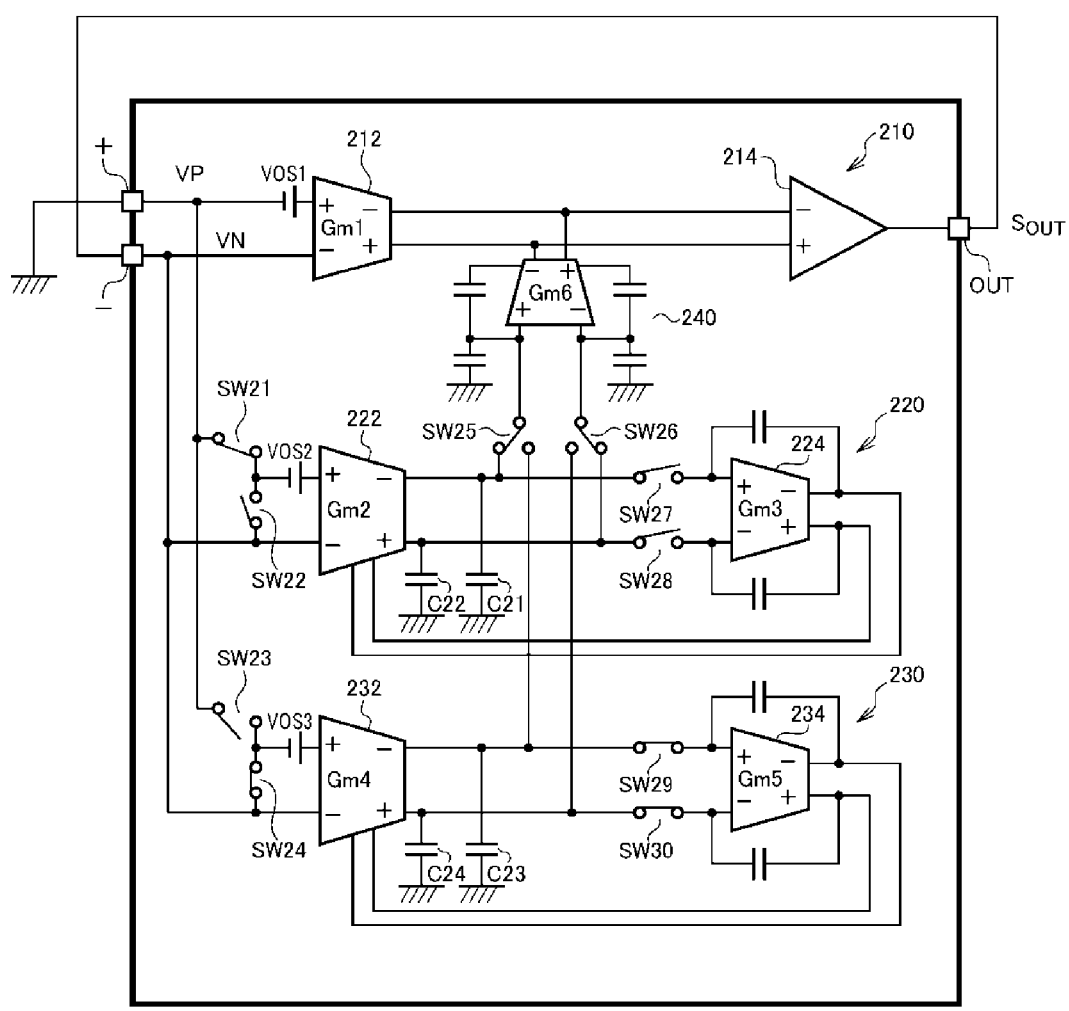
FIG. 1 is a circuit diagram showing a chopper stabilized amplifier investigated by the present inventors.

That is to say, by repeatedly switching the state between the first state ϕ1 and the second state ϕ2, the component that corresponds to the offset voltage $V_{OS2}$ is integrated with a polarity that is alternately switched between a given polarity and the opposite polarity. Thus, only the offset voltage $V_{OS1}$ component remains in the outputs $V_{5P}$ and $V_{5N}$ of the integrating circuit 24. That is to say, with the correction circuit 20 shown in FIG. 2, the offset voltage $V_{OS2}$ is canceled out. Such an arrangement does not require the second-stage gm amplifier 224 (234) as shown in FIG. 1, thereby allowing the circuit to have a simple configuration.

Figure 3A:
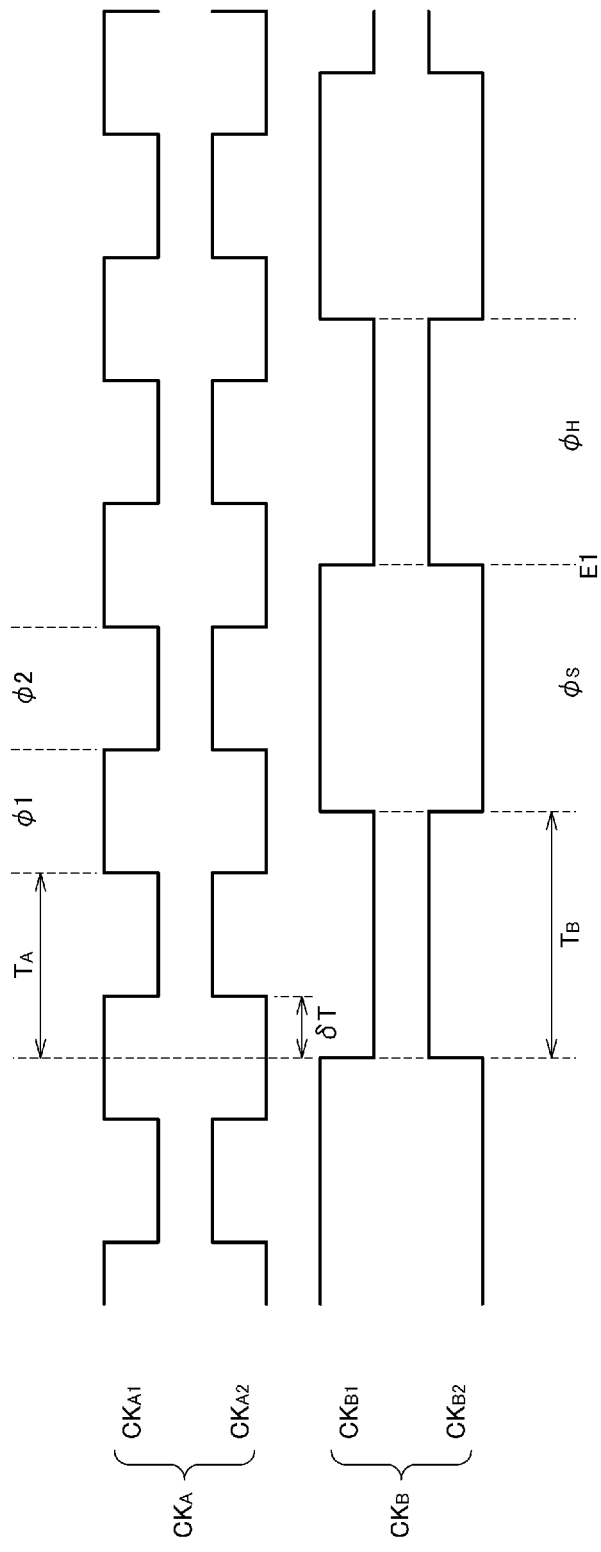
FIG. 3A is a waveform diagram showing an example of the operation of the chopper stabilized amplifier shown in FIG. 2.

FIG. 3A is a waveform diagram showing an example of the operation of the chopper stabilized amplifier 1 shown in FIG. 2. The first selector 30 and the second selector 32 are controlled according to the first clock signal $CK_A$. The integrating circuit 24 is controlled such that it enters the hold state at an edge timing of the first clock signal $CK_A$. Furthermore, the integrating circuit 24 is controlled such that it performs a sampling operation in a period in which the first clock signal $CK_A$ is stable.

By determining the switching timings for the sampling operation and the holding operation of the integrating circuit 24 and for the switching operations of the first selector 30 and the second selector 32, such an arrangement prevents the second current signal $I_2$ from being contaminated with noise due to the first clock signal $CK_A$ for chopper use.

For example, the integrating circuit 24 may be controlled according to a second clock signal $CK_B$. In this example, in a period in which the second clock signal $CK_B$ is set to a first level, the integrating circuit 24 may be set to the hold state $\phi_H$. Also, the timing of the edge E1 immediately before the hold state $\phi_H$ may be used as the sampling timing. The second clock signal $CK_B$ is temporarily shifted such that the edges of the second clock signal $CK_B$ do not overlap those of the first clock signal $CK_A$. This prevents the main amplifier 10 from being contaminated with noise due to the first clock signal $CK_A$.

The second clock signal $CK_B$ may be configured to have a period $T_B$ which is an integer multiple of the period $T_A$ of the first clock signal $CK_A$, e.g., which is twice the period $T_A$. Each edge of the second clock signal $CK_B$ is shifted by ⅛ of the period $T_B$ with respect to the corresponding edge of the first clock signal $CK_A$. In a case in which $T_B=T_A\times 2$, by employing a shift amount $\delta T=T_B/8$, such an arrangement provides maximum edge intervals, thereby making it most difficult to result in noise contamination. It should be noted that the combination of the frequency relation and the shift amount $\delta T$ is not restricted to such an arrangement.

Figure 3B:
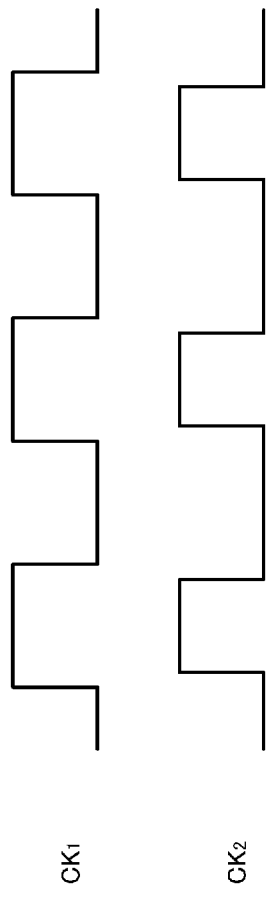
FIG. 3B is a waveform diagram showing a clock signal used in the chopper stabilized amplifier shown in FIG. 1.

For comparison, FIG. 3B shows clocks $CK_1$ and $CK_2$ used in the chopper stabilized amplifier 200 shown in FIG. 1. For example, a switch group of the switches SW21, SW24, SW29, and SW30, which are each shown as being on in FIG. 1, and the switches SW25 and SW26, each switch on and off according to the clock $CK_1$, and moreover another switch group of the switches SW22, SW23, SW27, and SW28, which are each shown as being off in FIG. 1, and the switches SW25 and SW26, each switch on and off according to the clock $CK_2$. With the chopper stabilized amplifier 200 shown in FIG. 1, by employing a pair of non-overlapping clocks as shown in FIG. 3B, such an arrangement prevents charge from leaking from the capacitors or the like. However, with such an arrangement, in principle the edge intervals between the two clocks $CK_1$ and $CK_2$ can only be increased to an insufficient interval, which results in chopper noise contamination in the main amplifier 210.

In contrast, with the chopper stabilized amplifier 1 according to the embodiment, there is no need to employ such non-overlapping clocks. Such an arrangement is capable of greatly reducing the effect of chopper noise as compared with an arrangement shown in FIG. 1.

The present invention encompasses various kinds of apparatuses and circuits that can be regarded as a block configuration or a circuit configuration shown in FIG. 2, or otherwise that can be derived from the aforementioned description. That is to say, the present invention is not restricted to a specific circuit configuration. More specific description will be made below regarding an example configuration for clarification and ease of understanding of the essence of the present invention and the circuit operation. That is to say, the following description will by no means be intended to restrict the technical scope of the present invention.

Figure 4:
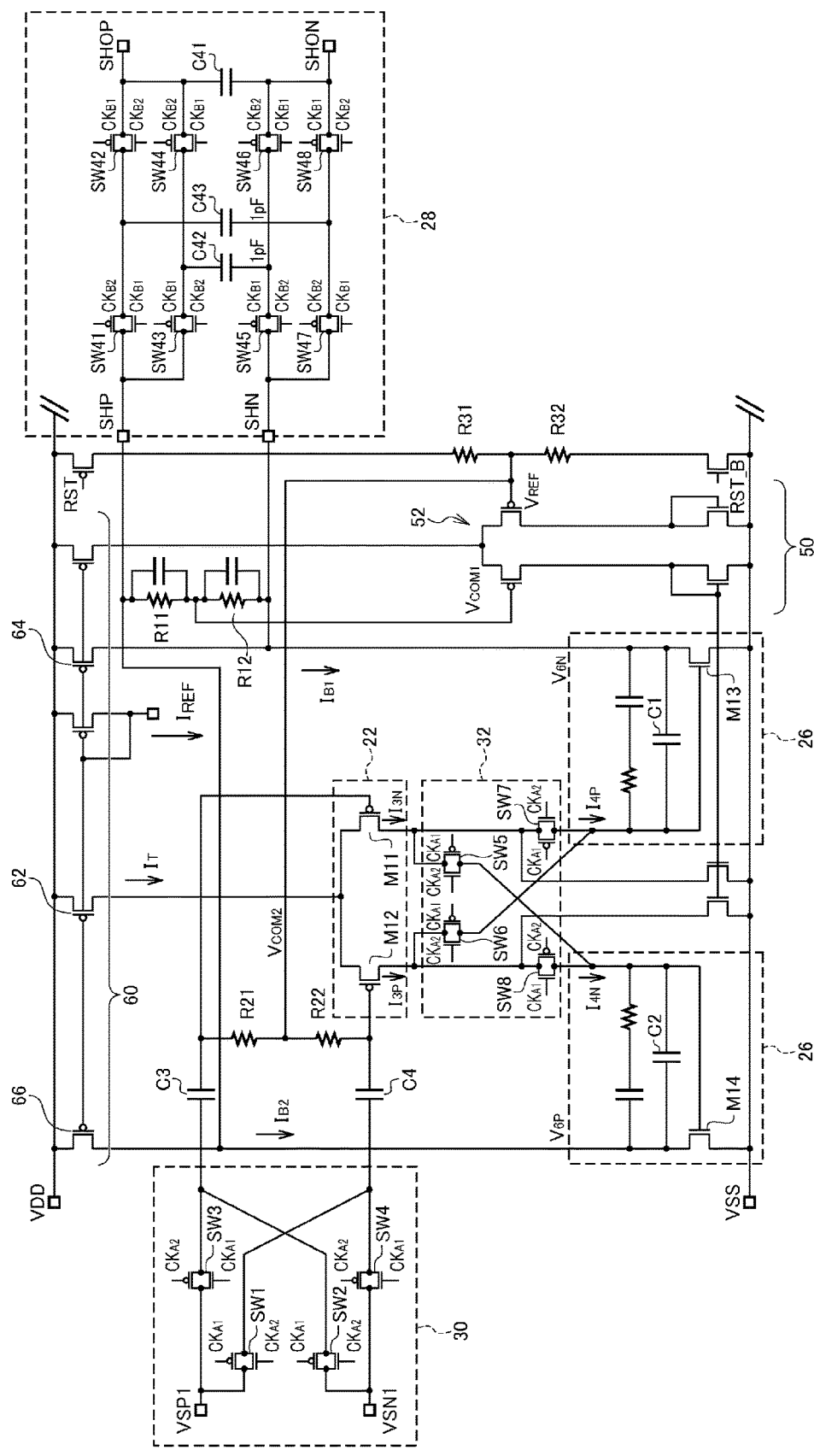
FIG. 4 is a circuit diagram showing an example configuration of a correction circuit.

FIG. 4 is a circuit diagram showing an example configuration of the correction circuit 20. It should be noted that, in FIG. 4, the third gm amplifier 40 is not shown.

A current mirror circuit 60 receives a reference current $I_{REF}$ as an input signal, and generates multiple currents that are each proportional to the reference current $I_{REF}$. The current mirror circuit 60 includes a tail current source 62, and constant current sources 64 and 66.

The second gm amplifier 22 includes a first transistor M11 and a second transistor M12. The first transistor M11 and the second transistor M12 are each configured as a PMOS transistor, and each arranged such that its source is connected to a tail current source 62 so as to supply a tail current $I_T$ to the second gm amplifier 22. The current that flows through the first transistor M11 corresponds to the current $I_{3N}$ shown in FIG. 2. The current that flows through the second transistor M12 corresponds to the current $I_{3P}$ shown in FIG. 2.

The integrator 26 mainly includes a third transistor M13 and a fourth transistor M14, each configured as an NMOS transistor, and a first capacitor C1 and a second capacitor C2. The third transistor M13 and the fourth transistor M14 are arranged such that their sources are connected to a fixed voltage line (ground line). Furthermore, a pair of current signals $I_{4P}$ and $I_{4N}$, which are output from the second selector 32 in the form of a differential signal, are input to the gates of the third transistor M13 and the fourth transistor M14, respectively. The first capacitor C1 is arranged between the gate and the drain of the third transistor M13. The second capacitor C2 is arranged between the gate and the drain of the fourth transistor M14. The third transistor M13 and the fourth transistor M14 are respectively biased with currents $I_{B1}$ and $I_{B2}$ having the same current value generated by the constant current sources 64 and 66.

A common mode feedback circuit 50 adjusts the bias state of the second gm amplifier 22 such that an intermediate voltage $V_{COM1}$, which is set to a voltage between the two output voltages $V_{6P}$ and $V_{6N}$ of the integrator 26, approaches a target voltage $V_{REF}$. That is to say, the intermediate voltage $V_{COM1}$ to be set to a voltage between the output voltages $V_{6P}$ and $V_{6N}$ is generated by means of resistors R11 and R12. Furthermore, a common voltage (intermediate voltage) $V_{COM2}$, which is set to a voltage between the two input voltages of the second gm amplifier 22, is generated by means of resistors R21 and R22. Moreover, an intermediate voltage $V_{COM3}$, which is set to a voltage between the power supply voltage VDD and the ground voltage VSS, is generated by means of resistors R31 and R32. The reference voltage $V_{REF}$ input to one input terminal of the differential amplifier 52 is determined based on the voltages $V_{COM2}$ and $V_{COM3}$.

The sample-and-hold circuit 28 includes switches SW41 through SW48, and capacitors C41, C42, and C43. The switches shown in FIG. 4 are each configured as a CMOS switch (transfer gate). Each switch comprises an NMOS transistor and a PMOS transistor that are controlled according to complementary clocks $CK_{A1}$ and $CK_{A2}$ ($CK_{B1}$ and $CK_{B2}$). The clock signals are shown in FIG. 3A.

Figure 5:
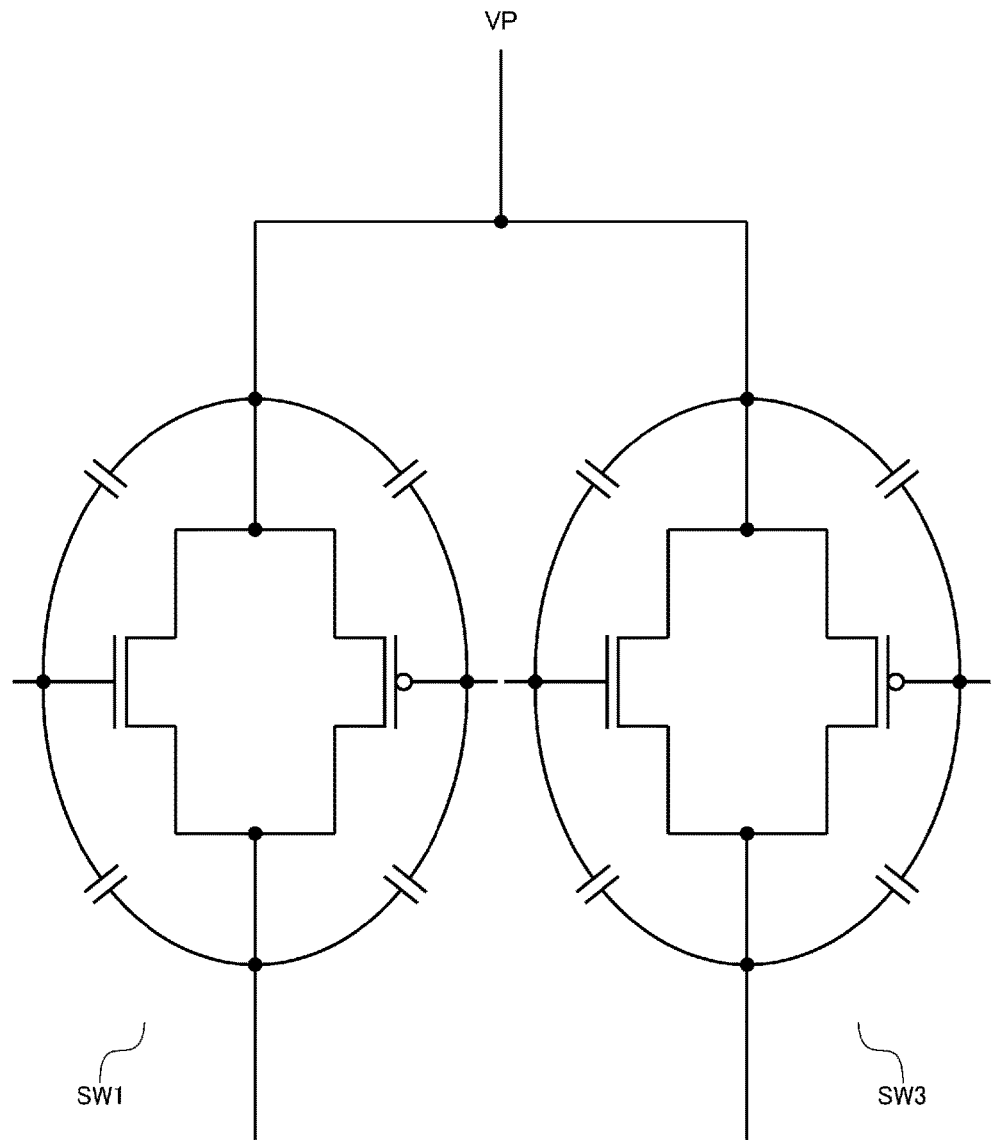
FIG. 5 is an equivalent circuit diagram showing a part of a first selector.

The chopper stabilized amplifier 1 according to the embodiment preferably has the following features. FIG. 5 is an equivalent circuit diagram showing a part of the first selector 30. Each switch SW of the first selector 30 is configured as a CMOS transfer gate including a PMOS transistor and an NMOS transistor. Each MOSFET has a parasitic capacitance that occurs between the gate and source and a parasitic capacitance that occurs between the gate and drain. When such a switch SW is controlled according to a clock signal applied to its gate, this leads to leakage of the clock signal to its drain side or source side via such a parasitic capacitance.

Here, description will be made with reference to FIG. 2 or 4. The second selector 32 and the sample-and-hold circuit 28 are each arranged such that both the input side and the output side are indirectly connected to the main amplifier 10. In contrast, the first selector 30 is arranged such that its input side is directly connected to the main amplifier 10. Accordingly, in a case in which the MOSFETs that form the first selector 30 have a large parasitic capacitance, this directly leads to noise contamination in the main amplifier 10 due to noise caused by the clock signal, which worsens the noise characteristics of the chopper stabilized amplifier 1.

In order to solve such a problem, each CMOS switch included in the first selector 30 is configured to be smaller than each CMOS switch included in the sample-and-hold circuit 28. Furthermore, each CMOS switch included in the first selector 30 is preferably configured to be smaller than each CMOS switch included in the second selector 32.

With the size of each CMOS transistor included in the first selector 30 as S1, with the size of each CMOS transistor included in the second selector 32 as S2, and with the size of each CMOS transistor included in the sample-and-hold circuit 28 as S3, for convenience, such CMOS transistors are preferably configured such that the relation S1≤S2<S3 holds true.

Figure 6:
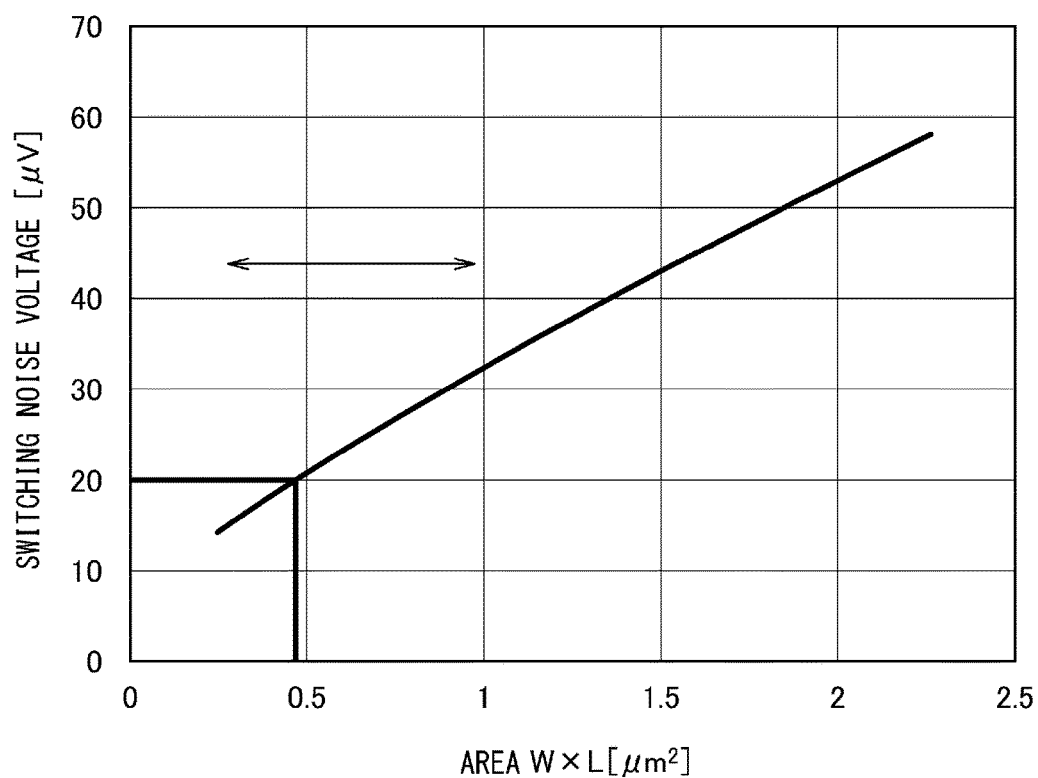
FIG. 6 is a diagram showing the relation between the size of the CMOS transistor of the first selector and the switching noise voltage.

FIG. 6 is a graph showing a relation between the size of each CMOS transistor included in the first selector 30 and the switching noise voltage. Here, the horizontal axis represents the area of the transistor (i.e., the product of the channel width W and the channel length L), and the vertical axis represents the switching noise. The area of each transistor may preferably be designed giving consideration to the allowable noise level. By designing each transistor to be smaller than 1 $\mu m^2$, such an arrangement provides noise characteristics that can be employed in a usage that requires strict noise conditions.

Also, each CMOS switch included in the first selector 30 may be configured including a PMOS transistor and an NMOS transistor that are each the same size. Typically, such a PMOS transistor and NMOS transistor are configured to have different respective sizes such that their current capacities are equal to each other (i.e., the P-channel is larger). However, in this case, the PMOS transistor has a parasitic capacitance that is larger than that of the NMOS transistor. This leads to an increase in noise leakage that occurs in the PMOS transistor. In order to solve such a problem, the P-channel and the N-channel are configured to be the same size, thereby further reducing chopper noise. As an example, an arrangement may be made with the channel length L=0.6 μm, and the channel width W=0.8 μm. In this case, the transistor area WL is 0.48 $\mu m^2$. In this case, the switching noise voltage is on the order of 20 μV.

Preferably, the chopper stabilized amplifier 1 according to the embodiment also has the following features.

In a case in which the chopper stabilized amplifier 1 is used for a usage in which it is continuously operated for a long period of time on the order of several to several dozen years in a state in which it receives a power supply (e.g., is operated as industrial equipment), there is a need to secure long-term circuit reliability. From the viewpoint of long-term reliability, the problem to be solved is variation of the transistor characteristics due to the hot carrier effect. In particular, in a case in which a given circuit is configured as a CMOS switch having a drain and a source configured as an input terminal and an output terminal, and in a case in which a great voltage difference is applied between the drain and source, this problem becomes serious. As the channel length L becomes larger, the hot carrier effect becomes larger.

Figure 7A:
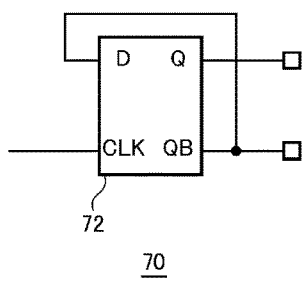
FIG. 7A is a circuit diagram showing a frequency divider circuit.
Figure 7B:
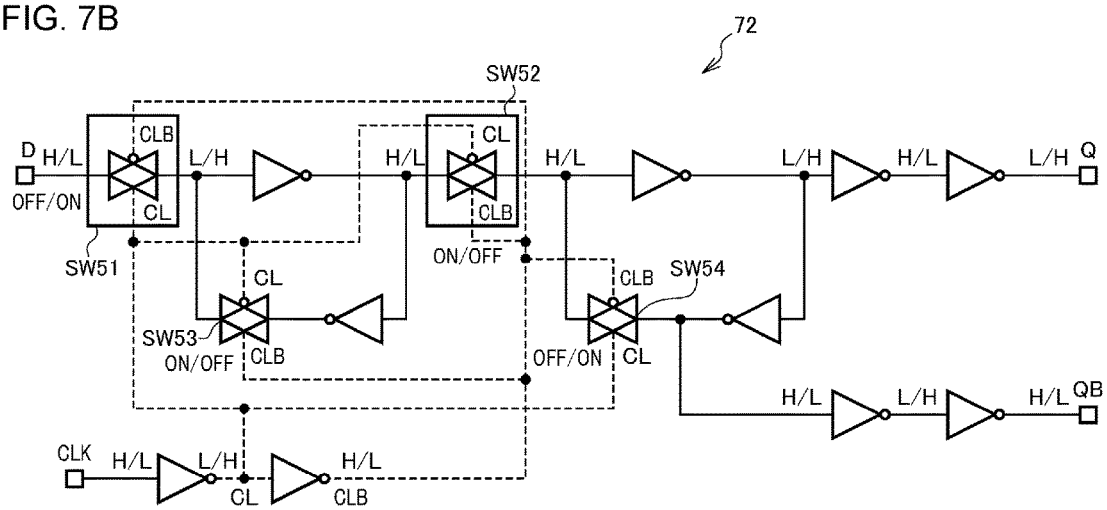
FIG. 7B is a circuit diagram showing a D flip-flop employed in the frequency divider circuit.
Figure 7C:
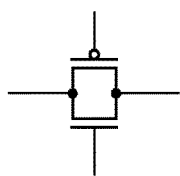
FIG. 7C is a circuit diagram showing a CMOS switch.

As described above, the chopper stabilized amplifier 1 according to the embodiment can be operated in synchronization with the first clock signal $CK_A$ for the chopper operation and the second clock signal $CK_B$ for controlling the sample-and-hold operation. The first clock signal $CK_A$ and the second clock signal $CK_B$ may be configured to have periods (frequencies) that have an integer multiple relation. In this case, the chopper stabilized amplifier 1 may further include a frequency divider circuit 70 that divides the frequency of the first clock signal $CK_A$ so as to generate the second clock signal $CK_B$. FIG. 7A is a circuit diagram showing the frequency divider circuit 70. FIG. 7B is a circuit diagram showing a D flip-flop employed in the frequency divider circuit 70. FIG. 7C is a circuit diagram showing the CMOS switch. The frequency divider circuit 70 shown in FIG. 1A includes a D flip-flop 72.

As shown in FIG. 7B, the D flip-flop 72 includes multiple switches SW51 through SW54 and multiple inverters. It should be noted that the configuration of such a D flip-flop 72 has a known configuration.

With such an arrangement employing such multiple switches, in a case in which there is a particular switch that involves a large voltage difference (large drain-source voltage) between the input terminal and the output terminal when it is turned off, in many cases, such a particular switch leads to a problem due to the hot carrier effect. In an example of the D flip-flop shown in FIG. 7C, such a particular switch corresponds to the switches SW51 and SW52, i.e., the switches SW51 and SW53 arranged between the input terminal D and the output terminal Q of the D flip-flop.

In a typical flip-flop according to conventional techniques, transistors of the same type are configured to have the same channel length L and the same channel width W. In contrast, in the present embodiment, the switches SW51 and SW53 are each configured to have a channel length that is greater than that of the other switches SW52 and SW54.

Directing attention to each switch, with conventional techniques, each switch typically comprises a PMOS transistor and an NMOS transistor having the same channel length and different channel widths such that the PMOS transistor and the NMOS transistor provide the same current capacity. In contrast, with the present embodiment, each switch is configured such that its NMOS transistor has a gate length that is greater than that of its PMOS transistor.

As a conventional example, all the switches are configured such that the NMOS transistor has a channel length L=0.8 μm and a channel width W=1.5 μm, and the PMOS transistor has a channel length L=0.8 μm and a channel width W=3.5 μm. In contrast, in the present embodiment, the switches SW1 and SW2 are each configured such that the NMOS transistor has a channel length L=2 μm and a channel width W=4.35 μm, and the PMOS transistor has a channel length L=0.8 μm and a channel width W=3.5 μm. In the present embodiment, such switches are configured such that the NMOS transistor has a channel length that is two times or more greater than that of a conventional switch.

In order to solve such a hot carrier problem, in a case in which all the MOS transistors are uniformly increased in size, such an arrangement also provides improved long-term reliability. However, such an arrangement leads to an increase in parasitic capacitance, resulting in degraded noise characteristics as described above, which is a tradeoff problem. In contrast, with the present embodiment, the NMOS transistor is designed to have an increased channel length only for particular switches, i.e., only for the switches that involve a relatively large voltage difference between the input terminal and the output terminal. Such an arrangement requires only a minimum increase in parasitic capacitance. That is to say, such an arrangement involves only a minimum degradation in the noise characteristics.

Figure 8:
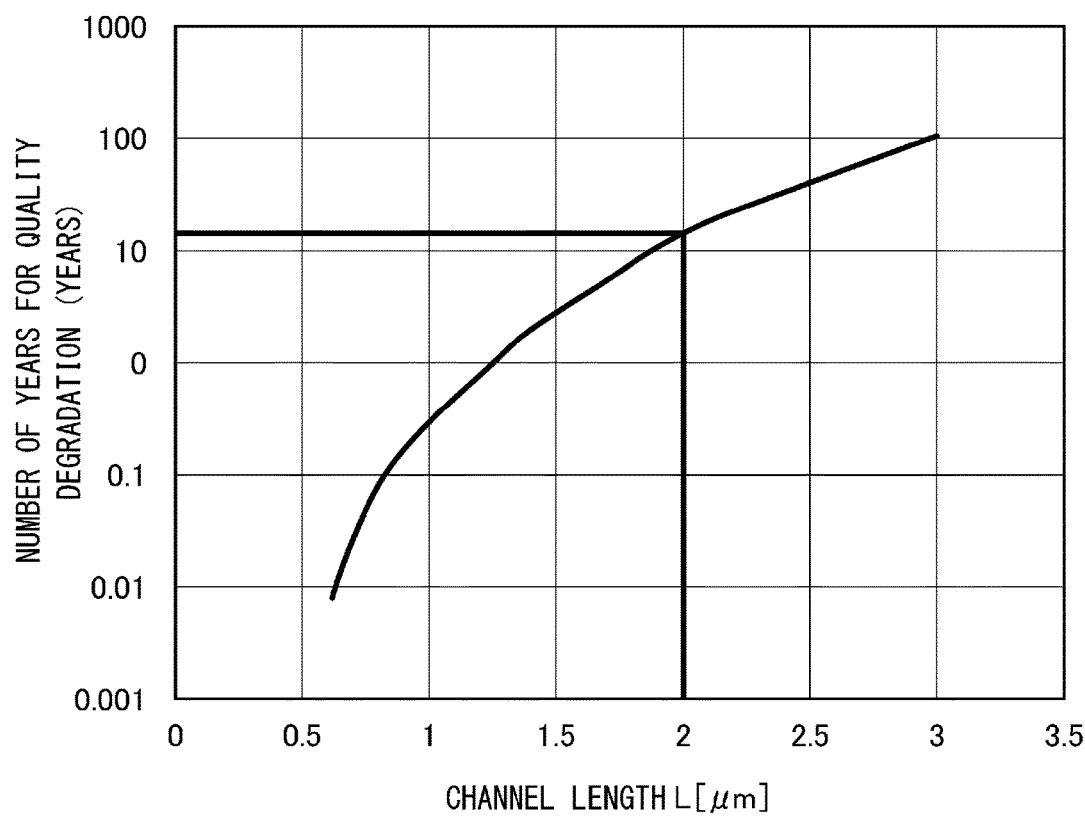
FIG. 8 is a diagram showing the relation between the channel length L and the number of years for quality degradation.

FIG. 8 is a diagram showing the relation between the channel length L and the number of years for quality degradation of the frequency divider circuit 70. By designing the switches SW51 and SW52 such that the NMOS transistor has a channel length of 2 μm, which is increased from a conventional channel length of 0.8 μm, such an arrangement allows the frequency divider circuit 70 to have a lifespan of 15 years, which is dramatically improved from 0.1 years, which is a lifespan of a conventional frequency divider circuit.

Description has been made above regarding the present invention with reference to the embodiment. The above-described embodiment has been described for exemplary purposes only, and is by no means intended to be interpreted restrictively. Rather, it can be readily conceived by those skilled in this art that various modifications may be made by making various combinations of the aforementioned components or processes, which are also encompassed in the technical scope of the present invention. Description will be made below regarding such modifications.

[First Modification]

Description has been made in the embodiment regarding an arrangement in which the first gm amplifier 12 and the third gm amplifier 40 are each configured in a differential output manner. Also, the first gm amplifier 12 and the third gm amplifier 40 may each have a single-ended output. In this case, by configuring the third gm amplifier 40 to have a push-pull output, such an arrangement is capable of canceling out the offset voltage $V_{OS1}$ irrespective of whether it is a positive offset voltage or a negative offset voltage.

[Second Modification]

The configuration of the integrating circuit 24 is not restricted to such an arrangement shown in FIG. 2. For example, the sample-and-hold circuit 28 and the integrator 26 may be monolithically integrated as a single unit. In many cases, such a circuit comprising an integrator and a sample-and-hold circuit thus monolithically integrated as a single unit is employed in various kinds of fields such as the sensor field. The technique according to the present invention is applicable to such an arrangement.

While the preferred embodiments of the present invention have been described using specific terms, such description is for illustrative purposes only, and it is to be understood that changes and variations may be made without departing from the spirit or scope of the appended claims.

What is claimed is:

1. A chopper stabilized amplifier comprising:
   a non-inverting input pin structured to receive a first voltage;
   an inverting input pin structured to receive a second voltage;
   a main amplifier structured to generate an output signal according to a difference between the first voltage and the second voltage; and
   a correction circuit,
   wherein the main amplifier comprises:
   a differential input stage structured to generate a first current signal, wherein the differential input stage includes a first gm amplifier having a non-inverting input terminal connected to the non-inverting input pin and an inverting input terminal connected to the inverting input pin; and
   an output stage structured to receive the first current signal so as to generate the output signal of the main amplifier,
   wherein the correction circuit comprises:
   a second gm amplifier configured as a fully differential amplifier structured to amplify a voltage difference between its non-inverting input terminal and its inverting input terminal, so as to output a differential current signal from its inverting output terminal and its non-inverting output terminal;
   an integrating circuit structured to integrate a differential input current input to its non-inverting input terminal and its inverting input terminal, structured to sample and hold the current integrated for a predetermined period, and structured to generate a differential voltage signal;
   a first selector arranged as an upstream stage of the second gm amplifier, so as to switch a state between: (i) a first state in which the non-inverting input pin and the inverting input pin are respectively connected to the inverting input terminal and the non-inverting input terminal of the second gm amplifier; and (ii) a second state in which the non-inverting input pin and the inverting input pin are respectively connected to the non-inverting input terminal and the inverting input terminal of the second gm amplifier;
   a second selector arranged downstream from the second gm amplifier, so as to switch a state between: (i) a first state in which the inverting output terminal and the non-inverting output terminal of the second gm amplifier are respectively connected to the inverting input terminal and the non-inverting input terminal of the integrating circuit; and (ii) a second state in which the inverting output terminal and the non-inverting output terminal of the second gm amplifier are respectively connected to the non-inverting input terminal and the inverting input terminal of the integrating circuit; and
   a third gm amplifier structured to convert the differential voltage signal generated by the integrating circuit into a second current signal, and superimpose the second current signal on the first current signal;
   wherein each of the first selector and the second selector is controlled according to a first clock signal,
   and wherein the integrating circuit is controlled according to a second clock signal,
   and wherein edges of the first clock signal are shifted from edges of the second clock signal.

2. The chopper stabilized amplifier according to claim 1, wherein the integrating circuit comprises:
   an integrator structured to integrate a differential input current input to the non-inverting input terminal and the inverting input terminal, so as to generate the differential voltage signal; and a sample-and-hold circuit structured to sample and hold the differential voltage signal generated by the integrator.

3. The chopper stabilized amplifier according to claim 1, wherein each of the first gm amplifier and the third gm amplifier is configured as a fully differential amplifier,
and wherein the second current signal configured as a differential signal is superimposed on the second current signal configured as a differential signal.

4. The chopper stabilized amplifier according to claim 1, wherein the integrating circuit is controlled such that the integrating circuit is set to a hold state at an edge timing of the first clock signal.

5. The chopper stabilized amplifier according to claim 1, wherein the integrating circuit is controlled such that the integrating circuit performs a sampling operation in a period in which the first clock is stable.

6. The chopper stabilized amplifier according to claim 1, wherein the second clock signal has a period $T_B$ which is an integer multiple of a period of the first clock signal.

7. The chopper stabilized amplifier according to claim 6, wherein the second clock signal has a period $T_B$ that is twice the period of the first clock signal.

8. The chopper stabilized amplifier according to claim 7, wherein each edge of the second clock is shifted by ⅛ of the period thereof $T_B/8$ with respect to an edge of the first clock signal.

9. The chopper stabilized amplifier according to claim 1, wherein the second gm amplifier comprises a first transistor and a second transistor, each of which is configured as a MOSFET (Metal Oxide Semiconductor Field Effect Transistor),
wherein a source of each of the first transistor and the second transistor is connected to a common tail current source,
and wherein the second gm amplifier outputs currents that respectively flow through the first transistor and the second transistor.

10. The chopper stabilized amplifier according to claim 2, wherein each of the first selector and the sample-and-hold circuit comprises a plurality of CMOS switches,
and wherein each of the plurality of CMOS switches included in the first selector is smaller than each of the plurality of CMOS switches included in the sample-and-hold circuit.

11. The chopper stabilized amplifier according to claim 1, wherein each of the first selector and the second selector comprises a plurality of CMOS switches,
and wherein each of the plurality of CMOS switches included in the first selector is smaller than each of the plurality of CMOS switches included in the second selector.

12. The chopper stabilized amplifier according to claim 1, wherein the first selector comprises a plurality of CMOS switches,
and wherein each of the plurality of CMOS switches comprises a P-channel MOSFET and an N-channel MOSFET, each of which is configured such that a product of a channel width W and a channel length L thereof is smaller than 1 μm².

13. The chopper stabilized amplifier according to claim 12, wherein each CMOS switch comprises a P-channel MOSFET and an N-channel MOSFET, each of which has the same size.

14. The chopper stabilized amplifier according to claim 1, further comprising a frequency divider circuit structured to divide a frequency of the first clock signal so as to generate the second clock signal,
wherein the frequency divider circuit comprises a D flip-flop,
wherein the D flip-flop comprises a plurality of CMOS switches,
and wherein, among the CMOS switches, a part that is arranged between an input terminal and an output terminal of the D flip-flop comprises an N-channel MOSFET having a channel length that is greater than a channel length of an N-channel MOSFET of the other part that is arranged in a different region of the D flip-flop.

15. The chopper stabilized amplifier according to claim 1, monolithically integrated on a single semiconductor substrate.

16. A chopper stabilized amplifier comprising:
a non-inverting input pin that receives a first voltage;
an inverting input pin that receives a second voltage;
a main amplifier that generates an output signal according to a difference between the first voltage and the second voltage; and
a correction circuit,
wherein the main amplifier comprises:
a differential input stage that generates a first current signal, wherein the differential input stage includes a first gm amplifier having a non-inverting input terminal connected to the non-inverting input pin and an inverting input terminal connected to the inverting input pin; and
an output stage that receives the first current signal so as to generate the output signal of the main amplifier,
wherein the correction circuit comprises:
a second gm amplifier configured as a fully differential amplifier that amplifies a voltage difference between its non-inverting input terminal and its inverting input terminal, so as to output a differential current signal from its inverting output terminal and its non-inverting output terminal;
an integrating circuit that integrates a differential input current input to its non-inverting input terminal and its inverting input terminal, that samples and holds the current integrated for a predetermined period, and that generates a differential voltage signal;
a first selector arranged as an upstream stage of the second gm amplifier, so as to switch a state between: (i) a first state in which the non-inverting input pin and the inverting input pin are respectively connected to the inverting input terminal and the non-inverting input terminal of the second gm amplifier; and (ii) a second state in which the non-inverting input pin and the inverting input pin are respectively connected to the non-inverting input terminal and the inverting input terminal of the second gm amplifier;
a second selector arranged downstream from the second gm amplifier, so as to switch a state between: (i) a first state in which the inverting output terminal and the non-inverting output terminal of the second gm amplifier are respectively connected to the inverting input terminal and the non-inverting input terminal of the integrating circuit and (ii) a second state in which the inverting output terminal and the non-inverting output terminal of the second gm amplifier are respectively connected to the non-inverting input terminal and the inverting input terminal of the integrating circuit and a third gm amplifier that converts the differential voltage signal generated by the integrating circuit into a second current signal, and that superimposes the second current signal on the first current signal, and wherein the integrating circuit comprises:

an integrator that integrates a differential input current input to the non-inverting input terminal and the inverting input terminal, so as to generate a differential voltage signal; and a sample-and-hold circuit that samples and holds the differential voltage signal generated by the integrator, wherein the integrator comprises:

a third MOSFET having a source connected to a fixed voltage line and a gate receiving one component of a differential current signal output from the second selector;

a fourth MOSFET having a source connected to the fixed voltage line and a gate receiving the other component of the differential current signal output from the second selector;

a first capacitor arranged between the gate and a drain of the third MOSFET; and a second capacitor arranged between the gate and a drain of the fourth MOSFET.

17. A chopper stabilized amplifier comprising:
a non-inverting input pin that receives a first voltage;
an inverting input pin that receives a second voltage;
a main amplifier that generates an output signal according to a difference between the first voltage and the second voltage; and
a correction circuit,
wherein the main amplifier comprises:
  a differential input stage that generates a first current signal, wherein the differential input stage includes a first gm amplifier having a non-inverting input terminal connected to the non-inverting input pin and an inverting input terminal connected to the inverting input pin; and
  an output stage that receives the first current signal so as to generate the output signal of the main amplifier,
wherein the correction circuit comprises:
  a second gm amplifier configured as a fully differential amplifier that amplifies a voltage difference between its non-inverting input terminal and its inverting input terminal, so as to output a differential current signal from its inverting output terminal and its non-inverting output terminal;
  an integrating circuit that integrates a differential input current input to its non-inverting input terminal and its inverting input terminal, that samples and holds the current integrated for a predetermined period, and that generates a differential voltage signal;
  a first selector arranged as an upstream stage of the second gm amplifier, so as to switch a state between: (i) a first state in which the non-inverting input pin and the inverting input pin are respectively connected to the inverting input terminal and the non-inverting input terminal of the second gm amplifier; and (ii) a second state in which the non-inverting input pin and the inverting input pin are respectively connected to the non-inverting input terminal and the inverting input terminal of the second gm amplifier;
  a second selector arranged downstream from the second gm amplifier, so as to switch a state between: (i)

a first state in which the inverting output terminal and the non-inverting output terminal of the second gm amplifier are respectively connected to the inverting input terminal and the non-inverting input terminal of the integrating circuit and (ii) a second state in which the inverting output terminal and the non-inverting output terminal of the second gm amplifier are respectively connected to the non-inverting input terminal and the inverting input terminal of the integrating circuit and a third gm amplifier that converts the differential voltage signal generated by the integrating circuit into a second current signal, and that superimposes the second current signal on the first current signal, and wherein the integrating circuit comprises:
  an integrator that integrates a differential input current input to the non-inverting input terminal and the inverting input terminal, so as to generate a differential voltage signal; and
  a sample-and-hold circuit that samples and holds the differential voltage signal generated by the integrator,
and wherein the chopper stabilized amplifier further comprises a common mode feedback circuit structured to adjust a bias state of the second gm amplifier such that an intermediate voltage between two output voltages of the integrator approaches a target voltage.

18. A chopper stabilized amplifier comprising:
a non-inverting input pin that receives a first voltage;
an inverting input pin that receives a second voltage;
a main amplifier that generates an output signal according to a difference between the first voltage and the second voltage; and
a correction circuit,
wherein the main amplifier comprises:
  a differential input stage that generates a first current signal, wherein the differential input stage includes a first gm amplifier having a non-inverting input terminal connected to the non-inverting input pin and an inverting input terminal connected to the inverting input pin; and
  an output stage that receives the first current signal so as to generate the output signal of the main amplifier,
wherein the correction circuit comprises:
  a second gm amplifier configured as a fully differential amplifier that amplifies a voltage difference between its non-inverting input terminal and its inverting input terminal, so as to output a differential current signal from its inverting output terminal and its non-inverting output terminal;
  an integrating circuit that integrates a differential input current input to its non-inverting input terminal and its inverting input terminal, that samples and holds the current integrated for a predetermined period, and that generates a differential voltage signal;
  a first selector arranged as an upstream stage of the second gm amplifier, so as to switch a state between: (i) a first state in which the non-inverting input pin and the inverting input pin are respectively connected to the inverting input terminal and the non-inverting input terminal of the second gm amplifier; and (ii) a second state in which the non-inverting input pin and the inverting input pin are respectively connected to the non-inverting input terminal and the inverting input terminal of the second gm amplifier;
  a second selector arranged downstream from the second gm amplifier, so as to switch a state between: (i)

a first state in which the inverting output terminal and the non-inverting output terminal of the second gm amplifier are respectively connected to the inverting input terminal and the non-inverting input terminal of the integrating circuit and (ii) a second state in which the inverting output terminal and the non-inverting output terminal of the second gm amplifier are respectively connected to the non-inverting input terminal and the inverting input terminal of the integrating circuit and a third gm amplifier that converts the differential voltage signal generated by the integrating circuit into a second current signal, and that superimposes the second current signal on the first current signal, and wherein the chopper stabilized amplifier further comprises:

a third capacitor arranged between a first output terminal of the first selector and one input terminal of the second gm amplifier; and a fourth capacitor arranged between a second output terminal of the first selector and the other input terminal of the second gm amplifier.

\* \* \* \* \*